(12) United States Patent
Nishita et al.

(10) Patent No.: US 11,658,458 B2
(45) Date of Patent: May 23, 2023

(54) OPTICAL DEVICE

(71) Applicant: FURUKAWA ELECTRIC CO., LTD., Tokyo (JP)

(72) Inventors: Masayoshi Nishita, Tokyo (JP); Masahiro Yoshida, Tokyo (JP); Etsuji Katayama, Tokyo (JP)

(73) Assignee: FURUKAWA ELECTRIC CO., LTD., Tokyo (JP)

(*) Notice: Subject to any disclaimer, the term of this patent is extended or adjusted under 35 U.S.C. 154(b) by 196 days.

(21) Appl. No.: 17/168,257

(22) Filed: Feb. 5, 2021

(65) Prior Publication Data

US 2021/0249836 A1 Aug. 12, 2021

(30) Foreign Application Priority Data

Feb. 12, 2020 (JP) .............................. JP2020-021905

(51) Int. Cl.
*H01S 5/022* (2021.01)
*G02B 6/42* (2006.01)
*H01S 5/024* (2006.01)

(52) U.S. Cl.
CPC ............ *H01S 5/022* (2013.01); *G02B 6/4256* (2013.01); *H01S 5/02469* (2013.01)

(58) Field of Classification Search
CPC ... H01S 5/022; H01S 5/02469; G02B 6/4256; G02B 6/4215; G02B 6/4242; G02B 6/4245; G02B 6/4267; G02B 6/4268; G02B 6/4292; G02B 6/4287; G02B 6/4269; G02B 6/4281; G02B 6/4296

See application file for complete search history.

(56) References Cited

U.S. PATENT DOCUMENTS

| 5,588,080 | A  | * | 12/1996 | Kawamura | ........... | G02B 6/3855 |
| | | | | | | 385/72 |
| 6,213,650 | B1 | * | 4/2001 | Moriyama | ........... | G02B 6/4214 |
| | | | | | | 385/94 |
| 2004/0052478 | A1 | * | 3/2004 | Minamino | ........... | G02B 6/4256 |
| | | | | | | 385/91 |

(Continued)

FOREIGN PATENT DOCUMENTS

JP 2018-107445 A 7/2018

OTHER PUBLICATIONS

Yamamoto et al., "Development of a Micro ITLA for Optical Digital Coherent Communication", Furukawa Review, No. 134, 2015, 10 pages (with English Translation).

*Primary Examiner* — Xinning(Tom) Niu
(74) *Attorney, Agent, or Firm* — Oblon, McClelland, Maier & Neustadt, L.L.P.

(57) ABSTRACT

An optical device includes: a base having first and second ends in first and second directions, respectively, and extends in the first direction; an optical module having a head adjacent to the base and is positioned close to the second end and a neck protruding from the head and is thinner than the head; a substrate attached on the base arranged with the head; and a pressing member having a first fixing portion fixed to the base, a second fixing portion fixed to the base, a first extension portion extending from the first fixing portion, a second extension portion extending from the second fixing portion, and a pressing portion provided in at least one of the first and the second extension portions and presses the head against the base.

16 Claims, 12 Drawing Sheets

(56) References Cited

U.S. PATENT DOCUMENTS

| | | | |
|---|---|---|---|
| 2018/0123316 A1* | 5/2018 | Nagarajan | H04B 10/501 |
| 2018/0183206 A1* | 6/2018 | Nishita | H01R 12/57 |
| 2018/0183214 A1* | 6/2018 | Dawson | H01S 5/0236 |
| 2020/0028319 A1* | 1/2020 | Kawahara | H01S 5/0071 |

* cited by examiner

# OPTICAL DEVICE

CROSS-REFERENCE TO RELATED APPLICATIONS

The present application claims priority to and incorporates by reference the entire contents of Japanese Patent Application No. 2020-021905 filed in Japan on Feb. 12, 2020.

BACKGROUND

The present disclosure relates to an optical device.

In the related art, an optical device in which an optical module and a substrate are attached on a base is known (for example, Japanese Laid-open Patent publication No. 2018-107445).

In this type of optical device, it is beneficial to obtain an optical device having a novel configuration with less inconvenience, for example, an optical device which can be configured more compactly.

SUMMARY

There is a need for providing an optical device having a novel configuration with less inconvenience, for example, an optical device which can be configured more compactly.

According to an embodiment, an optical device includes: a base which has a first end in a first direction and a second end which is an end in a second direction intersecting the first direction and extends in the first direction; an optical module which has a head which is adjacent to the base in a third direction intersecting the first direction and the second direction and is positioned close to the second end in a posture in which a longitudinal direction of the head is along the first direction and a neck which protrudes from the head in a direction opposite to the first direction and is thinner than the head; a substrate which is attached on the base to be arranged with the head in the second direction; and a pressing member which has a first fixing portion which is fixed to the base to be close to the first end, a second fixing portion which is fixed to the base on a side opposite to the first end with respect to the head and on a side opposite to the second end with respect to the neck, a first extension portion which extends from the first fixing portion, a second extension portion which extends from the second fixing portion, and a pressing portion which is provided in at least one of the first extension portion and the second extension portion and presses the head against the base in the direction opposite to the third direction.

DETAILED DESCRIPTION

Figure 1:
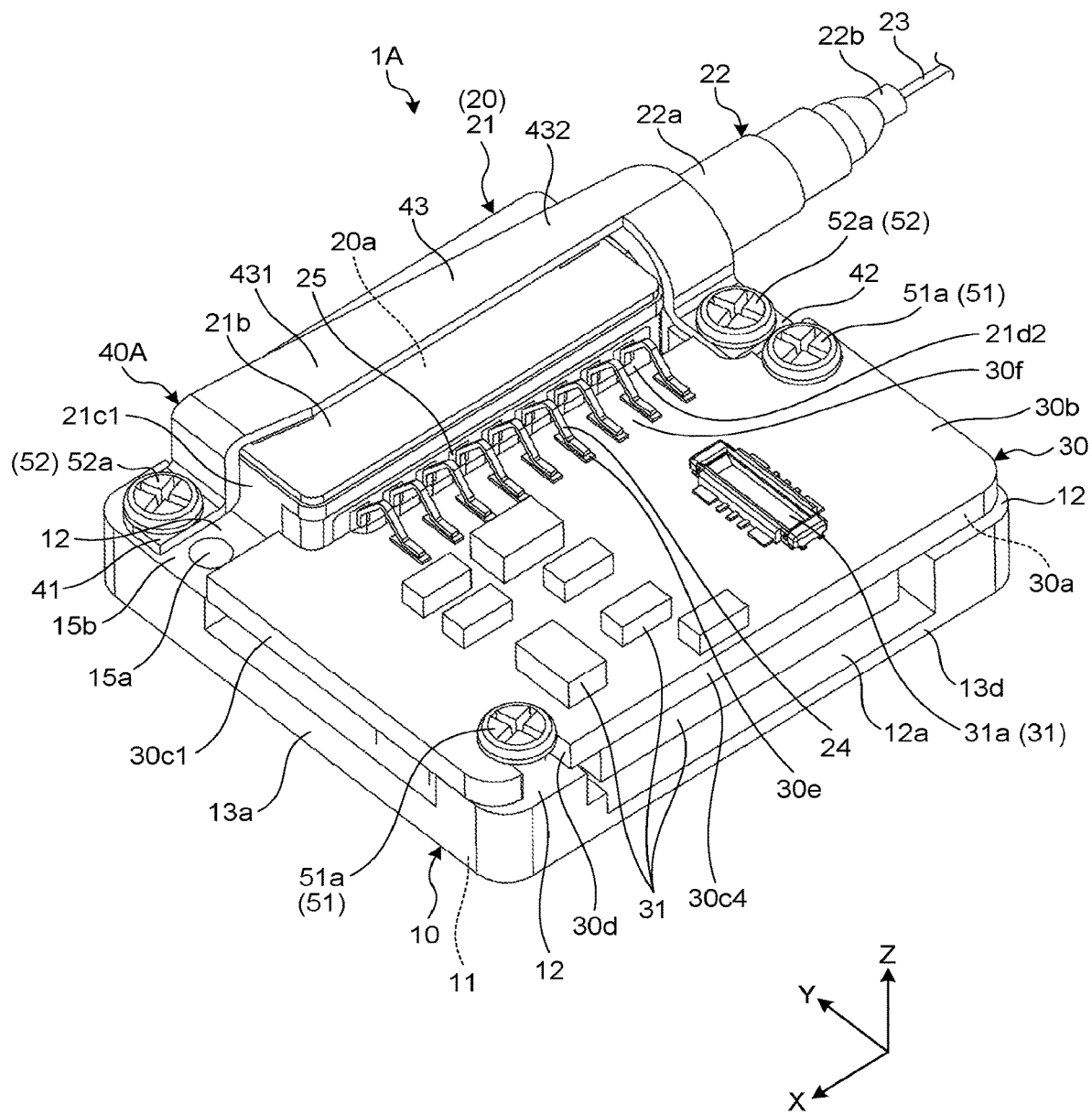
FIG. 1 is an exemplary and schematic perspective view of an optical device of a first embodiment.

Hereinafter, exemplary embodiments and modifications of the present disclosure are disclosed with reference to the accompanying drawings. The configurations of the embodiments and modifications described below, and the actions and results (effects) brought about by the configurations are examples. The present disclosure can also be realized by configurations other than those disclosed in the following embodiments and modifications. Further, according to the present disclosure, it is possible to obtain at least one of various effects (including derivative effects) obtained by the configuration.

The embodiments and modifications described below have similar configurations. Therefore, according to the configurations of the embodiments and modifications, the same actions and effects based on the similar configurations can be obtained. Further, in the following, the same reference numerals are given to those similar configurations, and duplicate explanations may be omitted.

In this specification, ordinal numbers are given for convenience in order to distinguish components, portions, and the like, and do not indicate priorities or orders.

Further, in each drawing, the X direction is represented by an arrow X, the Y direction is represented by an arrow Y, and the Z direction is represented by an arrow Z. The X, Y, and Z directions intersect and are orthogonal to each other. Incidentally, the X direction is referred to as a longitudinal direction, the Y direction is referred to as a width direction, and the Z direction may be referred to as a thickness direction, a height direction, or the normal direction of the surface of a substrate.

First Embodiment

FIG. 1 is a perspective view of an optical device 1A of this embodiment. The optical device 1A includes a base 10, an optical module 20, a circuit substrate 30, and a pressing member 40A.

The base 10 functions as a support member for the optical module 20 and the circuit substrate 30. Further, the base 10 is made of a metal material having high thermal conductivity such as an aluminum alloy, and functions as a heat radiating member which radiates heat generated in each unit, particularly the optical module 20.

Figure 2:
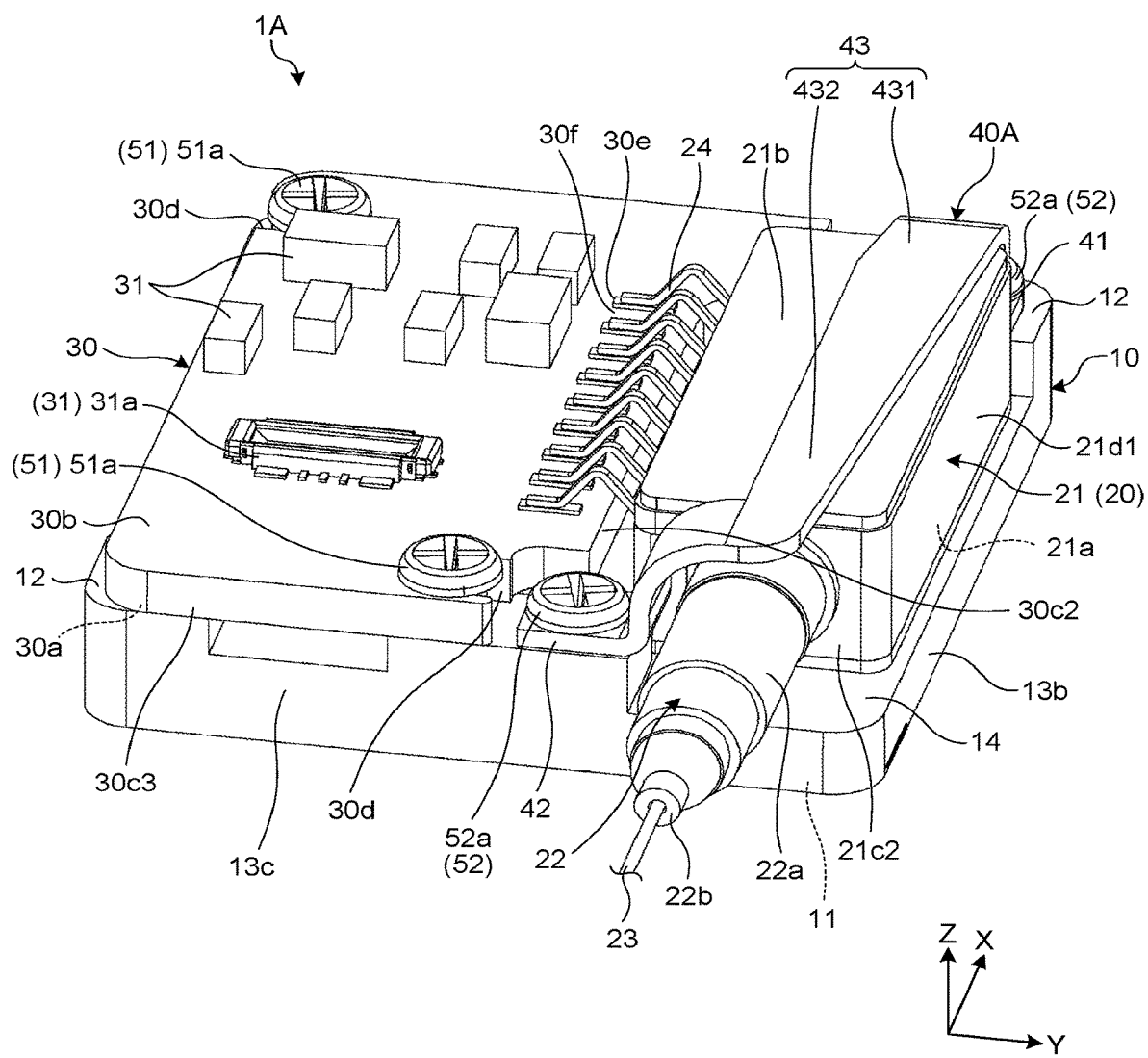
FIG. 2 is an exemplary and schematic perspective view of the optical device of the first embodiment and is a view seen in a direction different from that of FIG. 1.

As illustrated in FIGS. 1 and 2, the base 10 has a quadrangular and plate-like shape which intersects the Z direction and extends orthogonally to the Z direction. The base 10 has a bottom surface 11, a top surface 12, side surfaces 13a to 13d, and a stepped surface 14.

The bottom surface 11 faces in the direction opposite to the Z direction, intersects the Z direction, and extends orthogonally to the Z direction.

The top surface 12 faces the Z direction, intersects the Z direction, and extends orthogonally to the Z direction. The top surface 12 is substantially parallel to the bottom surface 11.

As illustrated in FIG. 1, the side surface 13a is an end in the X direction. The side surface 13a faces the X direction, intersects the X direction, and extends orthogonally to the X direction. In other words, the side surface 13a extends substantially along the Y and Z directions. Further, the side surface 13a extends long in the Y direction. The side surface 13a is an example of a first end. Incidentally, the side surface 13a may also be referred to as an end surface.

As illustrated in FIG. 2, the side surface 13b is an end in the Y direction. The side surface 13b faces the Y direction, intersects the Y direction, and extends orthogonally to the Y direction. In other words, the side surface 13b extends substantially along the X and Z directions. Further, the side surface 13b extends long in the X direction. The side surface 13b is an example of a second end. Incidentally, the side surface 13b may also be referred to as an end surface.

The side surface 13c is an end in the direction opposite to the X direction. The side surface 13c faces in the direction opposite to the X direction, intersects the X direction, and extends orthogonally to the X direction. In other words, the side surface 13c extends substantially along the Y and Z directions. The side surface 13c extends long in the Y direction. Further, the side surface 13c is substantially parallel to the side surface 13a. Incidentally, the side surface 13c may also be referred to as an end surface.

As illustrated in FIG. 1, the side surface 13d is an end in the direction opposite to the Y direction. The side surface 13d faces in the direction opposite to the Y direction, intersects the Y direction, and extends orthogonally to the Y direction. In other words, the side surface 13d extends substantially along the X and Z directions. The side surface 13d extends long in the X direction. Further, the side surface 13d is substantially parallel to the side surface 13b. Incidentally, the side surface 13d may also be referred to as an end surface.

As illustrated in FIG. 2, the stepped surface 14 is positioned between the bottom surface 11 and the top surface 12 in the Z direction, and is deviated from the top surface 12 in the direction opposite to the Z direction. The stepped surface 14 faces the Z direction, intersects the Z direction, and extends orthogonally to the Z direction. In other words, the stepped surface 14 extends substantially along the X and Y directions. The stepped surface 14 extends long in the X direction. Further, the stepped surface 14 is substantially parallel to the top surface 12. The stepped surface 14 may also be referred to as a notch or the bottom surface of a recess provided at the end (corner portion) of the base 10 in the Z and Y directions.

As illustrated in FIG. 1, the top surface 12 is provided with a recess 12a recessed in the direction opposite to the Z direction. The recess 12a houses a component 31 mounted on a surface 30a of the circuit substrate 30.

As illustrated in FIGS. 1 and 2, the optical module 20 includes a head 21, a neck 22, an optical fiber 23, and lead terminals 24.

The head 21 has a flat rectangular parallelepiped shape which is long in the X direction and has a thickness in the Z direction slightly shorter than a width in the Y direction. The head 21 is attached to the base 10 in a posture in which the longitudinal direction is along the X direction.

As illustrated in FIG. 2, a part of the head 21 and the neck 22 is adjacent to the stepped surface 14 of the base 10 in the Z direction. The head 21 is placed in contact with the stepped surface 14, and specifically, a bottom surface 21a of the head 21 and the stepped surface 14 are substantially in close contact with each other.

Incidentally, a heat radiating body may be interposed between the bottom surface 21a and the stepped surface 14. With the interposition of the heat radiating body, the heat generated by the head 21 is easily transferred to the base 10. In this case, the heat radiating body may be made of, for example, a synthetic resin material having excellent heat radiating property or graphite, may be a relatively thin sheet-like member (heat radiating sheet), or may be a pad-shaped relatively thick member (heat radiating pad). Further, the heat radiating body may be heat radiating grease.

A side surface 21d1 of the head 21 is positioned close to the side surface 13b of the base 10.

For example, the optical module 20 is a wavelength-tunable semiconductor laser module in which a wavelength-tunable semiconductor laser element 20a is built in the head 21, in other words, in the case of the head 21. However, the optical module 20 is not limited to this, and may have an optical element such as a light receiving element, a modulator, and a semiconductor optical amplifier. The wavelength-tunable semiconductor laser element 20a is an example of a semiconductor laser and also an example of a wavelength-tunable laser.

The optical module 20 outputs a laser beam having a desired wavelength and power from the optical fiber 23. The optical module 20 has a configuration in which a wavelength-tunable semiconductor laser element, an optical coupler, and a semiconductor optical amplifier are integrated, as disclosed in "Development of a MicroITLA for Optical Digital Coherent Communication" (Furukawa Electric Review, No. 134, (January 2015), p. 2-6, YAMAMOTO Atsushi, OKANIWA Takeo, YAFUSO Yoshitaka, NISHITA Masayoshi), for example. Further, the optical module 20 has a known wavelength locking mechanism using an etalon filter for controlling the wavelength of the wavelength-tunable semiconductor laser element. Further, the optical module 20 has a temperature control element and a temperature monitor element for controlling respective temperatures of the wavelength-tunable semiconductor laser element and the etalon filter.

As illustrated in FIGS. 1 and 2, the head 21 has the bottom surface 21a, a top surface 21b, end surfaces 21c1 and 21c2, and side surfaces 21d1 and 21d2.

As illustrated in FIG. 2, the bottom surface 21a faces in the direction opposite to the Z direction, intersects the Z direction, and extends orthogonally to the Z direction.

The top surface 21b faces the Z direction, intersects the Z direction, and extends orthogonally to the Z direction. Further, the top surface 21b is substantially parallel to the bottom surface 21a.

As illustrated in FIG. 1, the end surface 21c1 is an end in the X direction. The end surface 21c1 faces the X direction, intersects the X direction, and extends orthogonally to the X direction. In other words, the end surface 21c1 extends substantially along the Y and Z directions. Further, the end surface 21c1 has a rectangular shape (quadrangular shape) long in the Y direction.

As illustrated in FIG. 2, the end surface 21c2 is an end in the direction opposite to the X direction. The end surface 21c2 faces in the direction opposite to the X direction, intersects the X direction, and extends orthogonally to the X direction. In other words, the end surface 21c2 extends substantially along the Y and Z directions. The end surface 21c2 has a rectangular shape (quadrangular shape) long in the Y direction. Further, the end surface 21c2 is substantially parallel to the end surface 21c1.

The side surface 21d1 is an end in the Y direction. The side surface 21d1 faces the Y direction, intersects the Y direction, and extends orthogonally to the Y direction. In other words, the side surface 21d1 extends substantially along the X and Z directions. Further, the side surface 21d1 has a rectangular shape (quadrangular shape) long in the X direction. Incidentally, the side surface 21d1 may also be referred to as an end surface.

As illustrated in FIG. 1, the side surface 21d2 is an end in the direction opposite to the Y direction. The side surface 21d2 faces in the direction opposite to the Y direction, intersects the Y direction, and extends orthogonally to the Y direction. In other words, the side surface 21d2 extends substantially along the X and Z directions. The side surface 21d2 has a rectangular shape (quadrangular shape) long in the X direction. Further, the side surface 21d2 is substantially parallel to the side surface 21d1. Incidentally, the side surface 21d2 may also be referred to as an end surface.

As illustrated in FIG. 2, the neck 22 protrudes from the substantially central portion of the end surface 21c2 of the head 21 in the direction opposite to the X direction. The neck 22 has a cylindrical shape with a step. The diameter of the neck 22 is smaller than the thickness (height) of the head 21 in the Z direction. That is, the neck 22 is thinner than the head 21. Further, the diameter of the neck 22 is small as the neck is separated from the end surface 21c2. An outer peripheral surface 22a of each portion of the neck 22 is a cylindrical surface or a conical surface. However, the shape of the neck 22 is not limited to such a shape.

The optical fiber 23 extends in the direction opposite to the X direction from the tip of the neck 22, in other words, an end 22b in the direction opposite to the X direction.

In this embodiment, the lead terminal 24 is integrated with the optical module 20 as an example. However, the present disclosure is not limited to this, and as another example, the lead terminal 24 may be attached between the optical module 20 and the circuit substrate 30 when assembling the optical device 1A. A plurality of lead terminals 24 are arranged in the X direction at predetermined intervals (for example, even intervals).

The lead terminal 24 is a conductor through which a signal and electric power are transmitted and received between the optical module 20 and the circuit substrate 30. For example, the lead terminal 24 has a bent elongated plate-like or columnar shape and is made of a conductive metal material such as a copper-based material or an aluminum-based material. For example, the lead terminal 24 can be made by general machining such as pressing, bending, and cutting.

As illustrated in FIG. 1, each of the lead terminals 24 electrically connects a conductor 25 exposed on the side surface 21d2 of the head 21 and a conductor 30e provided on the circuit substrate 30.

The circuit substrate 30 is adjacent to the base 10 in the Z direction, and is arranged with a part of the head 21 and the neck 22 of the optical module 20 in the Y direction. The circuit substrate 30 is an example of a substrate.

A component 31 such as an electronic component or an electrical component is mounted on the circuit substrate 30. The conductor of the circuit substrate 30 and the component 31 constitute a control circuit of the optical module 20. The control circuit supplies a driving current to the optical module 20 on the basis of various monitor signals output from the optical module 20, and controls the operation of the optical module 20. For example, the control circuit includes a digital arithmetic unit, a memory, a current control circuit, a temperature monitor circuit, an optical power monitor circuit, a wavelength monitor circuit and the like. The control circuit is electrically connected to a host device (not illustrated) via an electrical connector 31a. Through the electrical connector 31a, the control circuit transmits and receives an electric signal to and from the host device, and the optical device 1A receives power from the host device. The circuit substrate 30 is an example of a substrate. Incidentally, the component 31 includes the electrical connector 31a.

The circuit substrate 30 has an insulator 30f and a conductor. The circuit substrate 30 has a conductor (not illustrated) inside the circuit substrate 30 and the conductor 30e exposed to the outside of the circuit substrate 30 as conductors. In this embodiment, the circuit substrate 30 is, as an example, a rigid substrate and a multilayer substrate. However, the present disclosure is not limited to this, and the circuit substrate 30 may be a single-sided substrate, a double-sided substrate, or a flexible substrate.

The circuit substrate 30 extends intersecting and orthogonal to the Z direction. The circuit substrate 30 has a quadrangular and plate-like shape.

The circuit substrate 30 has the surface 30a which is an end in the direction opposite to the Z direction and a surface 30b which is an end in the Z direction. The surface 30a faces in the direction opposite to the Z direction and intersects the Z direction to be orthogonal to the Z direction. The surface 30b faces the Z direction and intersects the Z direction to be orthogonal to the Z direction. The surface 30a is substantially parallel to the surface 30b. Incidentally, the surface 30a may also be referred to as a back surface, and the surface 30b may also be referred to as a front surface. The Z direction can also be referred to as the thickness direction of the circuit substrate 30.

As illustrated in FIG. 1, the circuit substrate 30 has ends 30c1 and 30c4. The end 30c1 is an end in the X direction and extends substantially along the Y direction. The end 30c4 is an end in the direction opposite to the Y direction and extends substantially along the X direction.

As illustrated in FIG. 2, the circuit substrate 30 has ends 30c2 and 30c3. The end 30c2 is an end in the Y direction and extends substantially along the X directions. The end 30c3 is an end in the direction opposite to the X direction and extends substantially along the Y direction. The end 30c2 is substantially parallel to the end 30c4, and the end 30c3 is substantially parallel to the end 30c1.

The circuit substrate 30 is attached on the base 10 in a state of being mounted on the top surface 12 of the base 10. The circuit substrate 30 is attached to the base 10 by a fixture 51. In this embodiment, as an example, the base 10 is provided with an internal thread hole (not illustrated) opened in the Z direction, and the fixture 51 is a screw or a bolt which has an external thread (not illustrated) which meshes with the internal thread hole and a head 51a. Further, the circuit substrate 30 is provided with a notch 30d as an opening through which the fixture 51 is passed. When the fixture 51 is attached to the base 10 in a state where the head 51a overlaps the peripheral portion of the notch 30d in the Z direction such that the external thread meshes with the internal thread hole, the head 51a presses the peripheral portion of the notch 30d toward the base 10 in the direction opposite to the Z direction, and thus the circuit substrate 30 is attached to the base 10. Incidentally, in a case where the base 10 has an external thread such as a stud bolt, the fixture 51 may be a nut having an internal thread. Further, the circuit substrate 30 may be provided with a through hole as an opening instead of the notch 30d. Further, the fixture may be a member, such as a rivet, different from a screw and a bolt.

The pressing member 40A is attached to the base 10 and presses the head 21 of the optical module 20 against the base 10 in the direction opposite to the Z direction. For example, the pressing member 40A has a bent plate-like shape and can be made of a metal material such as stainless steel. Further, the pressing member 40A can be made by general machining such as pressing, bending, and cutting, for example.

Figure 3:
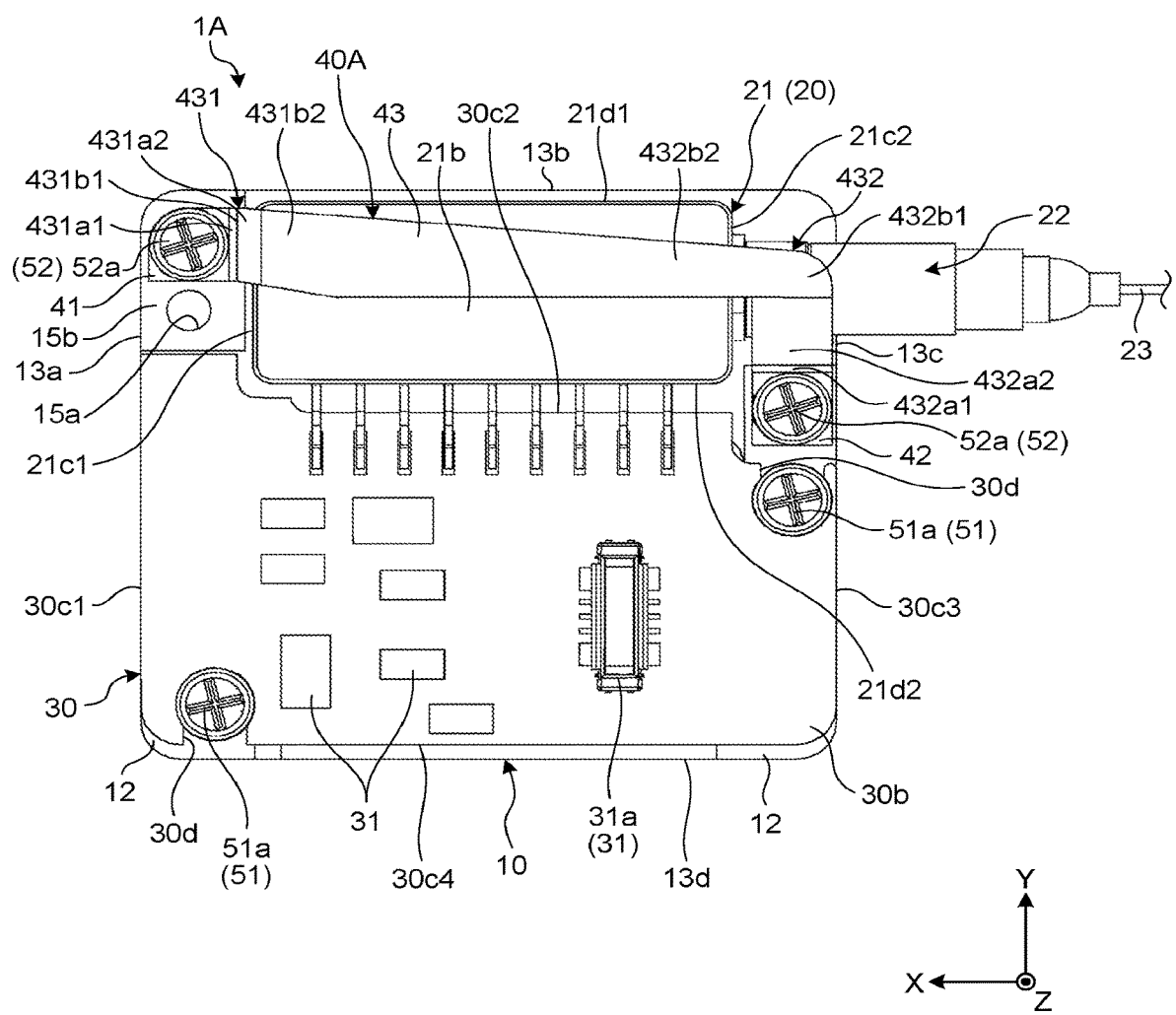
FIG. 3 is an exemplary and schematic plan view of the optical device of the first embodiment.
Figure 4:
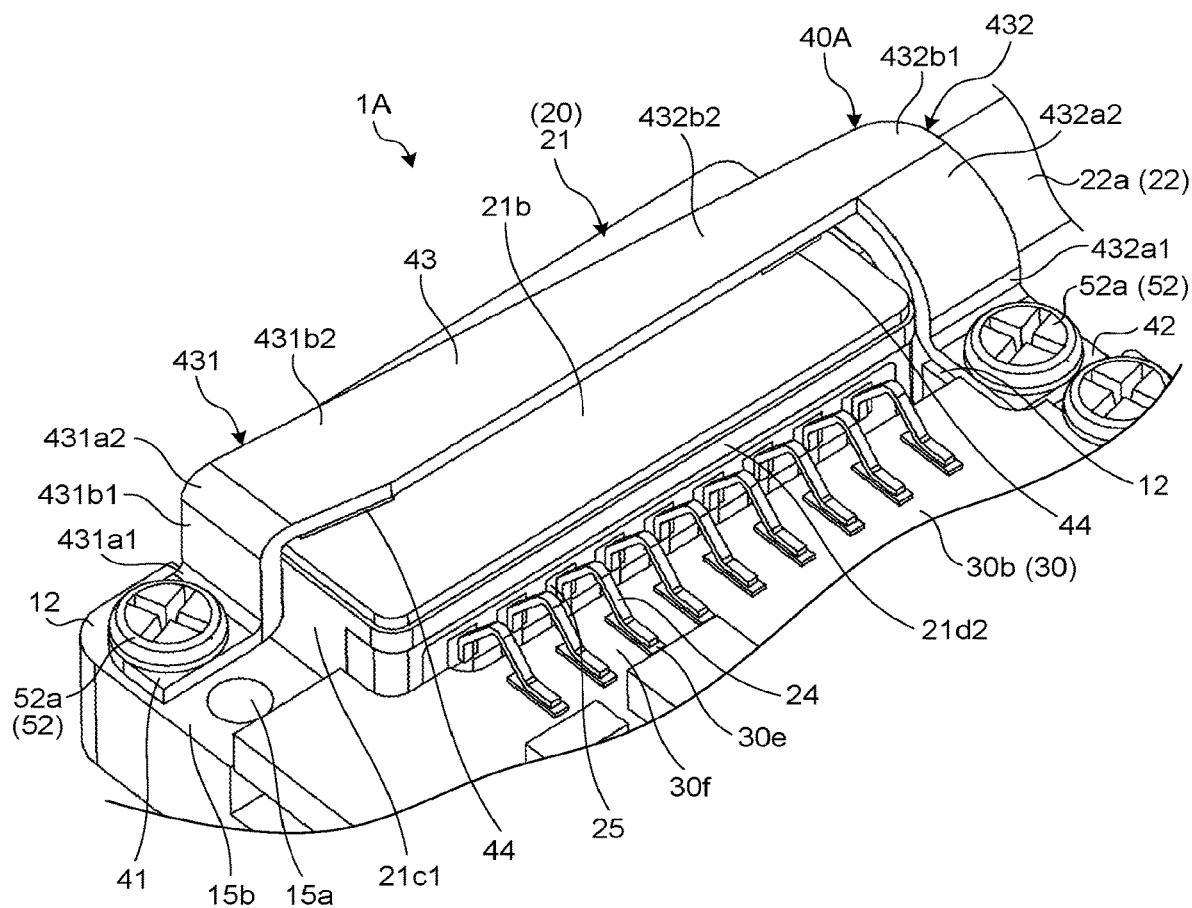
FIG. 4 is an enlarged view of a part of FIG. 1.

FIG. 3 is a plan view of the optical device 1A, and FIG. 4 is an enlarged view of a part of FIG. 1. As illustrated in FIGS. 3 and 4, the pressing member 40A has a first fixing portion 41, a second fixing portion 42, and an intermediate portion 43. The intermediate portion 43 connects the first fixing portion 41 and the second fixing portion 42.

The first fixing portion 41 is positioned close to the side surface 13a. In other words, the first fixing portion 41 is adjacent to the side surface 13a in the direction opposite (longitudinal direction) to the X direction. The first fixing portion 41 is attached to the base 10 by a fixture 52. In this embodiment, as an example, the base 10 is provided with an internal thread hole (not illustrated) opened in the Z direction, and the fixture 52 is a screw or a bolt which has an external thread (not illustrated) which meshes with the internal thread hole and a head 52a. Further, the first fixing portion 41 is provided with a through hole (not illustrated) as an opening through which the external thread of the fixture 52 is passed. When the fixture 52 is attached to the base 10 in a state where the head 52a overlaps the peripheral portion of the through hole in the Z direction such that the external thread meshes with the internal thread hole, the head 52a presses the peripheral portion of the through hole toward the base 10 in the direction opposite to the Z direction, and thus the first fixing portion 41 is attached to the base 10. Incidentally, in a case where the base 10 has an external thread such as a stud bolt, the fixture 52 may be a nut having an internal thread. Further, the first fixing portion 41 may be provided with a notch as an opening instead of the through hole. Further, the fixture may be a member, such as a rivet, different from a screw and a bolt.

The second fixing portion 42 is positioned on the side opposite to the side surface 13a with respect to the head 21 and on the side opposite to the side surface 13b of the base 10 with respect to the neck 22. The second fixing portion 42 is also attached to the base 10 by the fixture 52. The second fixing portion 42 has the same configuration as the first fixing portion 41 and is attached to the base 10 by the fixture 52 similarly to the first fixing portion 41.

The intermediate portion 43 has an extension portion 431 extending from the first fixing portion 41 and an extension portion 432 extending from the second fixing portion 42. In this embodiment, the extension portion 431 and the extension portion 432 are integrally connected. The extension portion 431 is an example of the first extension portion, and the extension portion 432 is an example of the second extension portion. In this embodiment, for convenience, in the intermediate portion 43, the portion from the first fixing portion 41 to the central position of the intermediate portion 43 in the X direction is referred to as the extension portion 431, and the portion from the second fixing portion 42 to the central position of the intermediate portion 43 in the X direction is referred to as the extension portion 432.

The extension portion 431 has a bent portion 431a1, a flat portion 431b1, a bent portion 431a2, and a flat portion 431b2.

The bent portion 431a1 is adjacent to the first fixing portion 41 in the direction opposite to the X direction. In the bent portion 431a1, the extension portion 431 is bent toward the Z direction when the distance from the first fixing portion 41 increases.

The flat portion 431b1 is adjacent to the bent portion 431a1 in the Z direction. In the flat portion 431b1, the extension portion 431 extends toward the Z direction when the distance from the first fixing portion 41 increases. The flat portion 431b1 is positioned close to the end surface 21c1 of the head 21, but slightly spaced in the X direction. That is, the flat portion 431b1 extends along the end surface 21c1 in the Z direction.

The bent portion 431a2 is adjacent to the flat portion 431b1 in the Z direction. In the bent portion 431a2, the extension portion 431 is bent toward the direction opposite to the X direction when the distance from the first fixing portion 41 increases. The bent portion 431a2 is bent to bypass the corner portion between the end surface 21c1 and the top surface 21b of the head 21.

The flat portion 431b2 is adjacent to the bent portion 431a2 in the direction opposite to the X direction. In the flat portion 431b2, the extension portion 431 extends toward the direction opposite to the X direction when the distance from the first fixing portion 41 increases. The flat portion 431b2 extends along the top surface 21b of the head 21 in the direction opposite to the X direction. In this embodiment, a gap is provided between the flat portion 431b2 and the top surface 21b, but it is to be noted that such a gap may not be provided.

The extension portion 431 has a substantially constant width in the Y direction from the first fixing portion 41 to the bent portion 431a1, the flat portion 431b1, and the bent portion 431a2. On the other hand, in the flat portion 431b2, the width of the extension portion 431 in the Y direction changes when the distance from the first fixing portion 41 increases.

In the extension portion 431, the flat portion 431b2 is positioned on the side opposite to the base 10 with respect to the head 21. Further, the bent portion 431a1, the flat portion 431b1, and the bent portion 431a2 extend between the flat portion 431b2 and the first fixing portion 41. Then, as illustrated in FIG. 3, when viewed in the direction opposite to the Z direction (that is, even when viewed in the Z direction), the first fixing portion 41, the bent portion 431a1, the flat portion 431b1, and the bent portion 431a2 are arranged in the X direction. The flat portion 431b2 is an example of the first portion, and the bent portion 431a1, the flat portion 431b1 and the bent portion 431a2 are examples of the second portion. Incidentally, the second portion may extend between the first portion and the first fixing portion 41, and is not limited to such a configuration.

As illustrated in FIG. 3, the base 10 is provided with an opening 15a for fixing the base 10 to another member. For example, the opening 15a is a through hole extending in the Z direction and penetrating between the bottom surface 11 and the top surface 12. However, the opening 15a is not limited to this, and may be a notch, for example.

The base 10 is attached to another member (not illustrated) by a fixture (not illustrated). In this embodiment, as an example, another member is provided with an internal thread hole (not illustrated) opened in the Z direction, and the fixture is a screw or a bolt which has an external thread which meshes with the internal thread hole and a head.

When the fixture is attached to the other member in a state where the head of the fixture overlaps a peripheral portion 15b of the opening 15a in the Z direction such that the external thread meshes with the internal thread hole, the head of the fixture presses the peripheral portion 15b of the opening 15a toward the other member in the direction opposite to the Z direction, and thus the base 10 is attached to the other member. Incidentally, in a case where the other member has an external thread such as a stud bolt, the fixture may be a nut having an internal thread. Further, the base 10 may be provided with a notch instead of the opening 15a which is a through hole. Further, the fixture may be a member, such as a rivet, different from a screw and a bolt.

As illustrated in FIG. 3, when viewed in the direction opposite to the Z direction (that is, even when viewed in the Z direction), the opening 15a and the peripheral portion 15b are positioned to be deviated from the first fixing portion 41 in the direction opposite to the Y direction and adjacently to the first fixing portion 41. The peripheral portion 15b is an example of an attached portion, and the fixture in this case is an example of a fixing member.

On the other hand, as illustrated in FIGS. 3 and 4, the extension portion 432 has a bent portion 432a1, a bent portion 432a2, a flat portion 432b1, and a flat portion 432b2.

The bent portion 432a1 is adjacent to the second fixing portion 42 in the Y direction. In the bent portion 432a1, the extension portion 432 is bent toward the Z direction when the distance from the second fixing portion 42 increases.

The bent portion 432a2 is adjacent to the bent portion 432a1 in the Y direction and the Z direction. In the bent portion 432a2, the extension portion 432 is bent toward the Y direction when the distance from the second fixing portion 42 increases. An S-shaped bent portion is formed by the bent portion 432a1 and the bent portion 432a2.

The flat portion 432b1 is adjacent to the bent portion 432a2 in the Y direction. In the flat portion 432b1, the extension portion 432 extends toward the X direction when the distance from the second fixing portion 42 increases. Further, as illustrated in FIG. 3, when viewed in the direction opposite to the Z direction (that is, even when viewed in the Z direction), the extension portion 432 is bent into an L shape between the bent portion 432a2 and the flat portion 432b1. Incidentally, the flat portion 432b1 is a portion deviated from the head 21 in the direction opposite to the X direction when viewed in the direction opposite to the Z direction (that is, even when viewed in the Z direction) as illustrated in FIG. 3.

The flat portion 432b2 is adjacent to the flat portion 432b1 in the X direction. In the flat portion 432b2, the extension portion 432 extends toward the X direction when the distance from the second fixing portion 42 increases. The flat portion 432b2 is a portion which overlaps the head 21 when viewed in the direction opposite to the Z direction (that is, even when viewed in the Z direction) as illustrated in FIG. 3. The flat portion 432b2 extends along the top surface 21b of the head 21 in the X direction. In this embodiment, a gap is provided between the flat portion 432b2 and the top surface 21b, but no gap may be provided.

The extension portion 432 has a substantially constant width in the X direction from the second fixing portion 42 to the bent portion 432a1 and the bent portion 432a2. On the other hand, in the flat portion 432b1 and the flat portion 432b2, the width of the extension portion 432 in the Y direction changes when the distance from the second fixing portion 42 increases.

In the extension portion 432, the flat portion 432b2 is positioned on the side opposite to the base 10 with respect to the head 21. Further, the bent portion 432a1, the bent portion 432a2, and the flat portion 432b1 extend between the flat portion 432b2 and the second fixing portion 42. Then, as illustrated in FIG. 3, when viewed in the direction opposite to the Z direction (that is, even when viewed in the Z direction), the bent portion 432a1, the bent portion 432a2, and the flat portion 432b1 are deviated from the second fixing portion 42 in the Y direction. The flat portion 432b2 is an example of a third portion, and the bent portion 432a1, the bent portion 432a2, and the flat portion 432b1 are examples of a fourth portion. Incidentally, the fourth portion may extend between the third portion and the second fixing portion 42, and is not limited to such a configuration.

Figure 5:
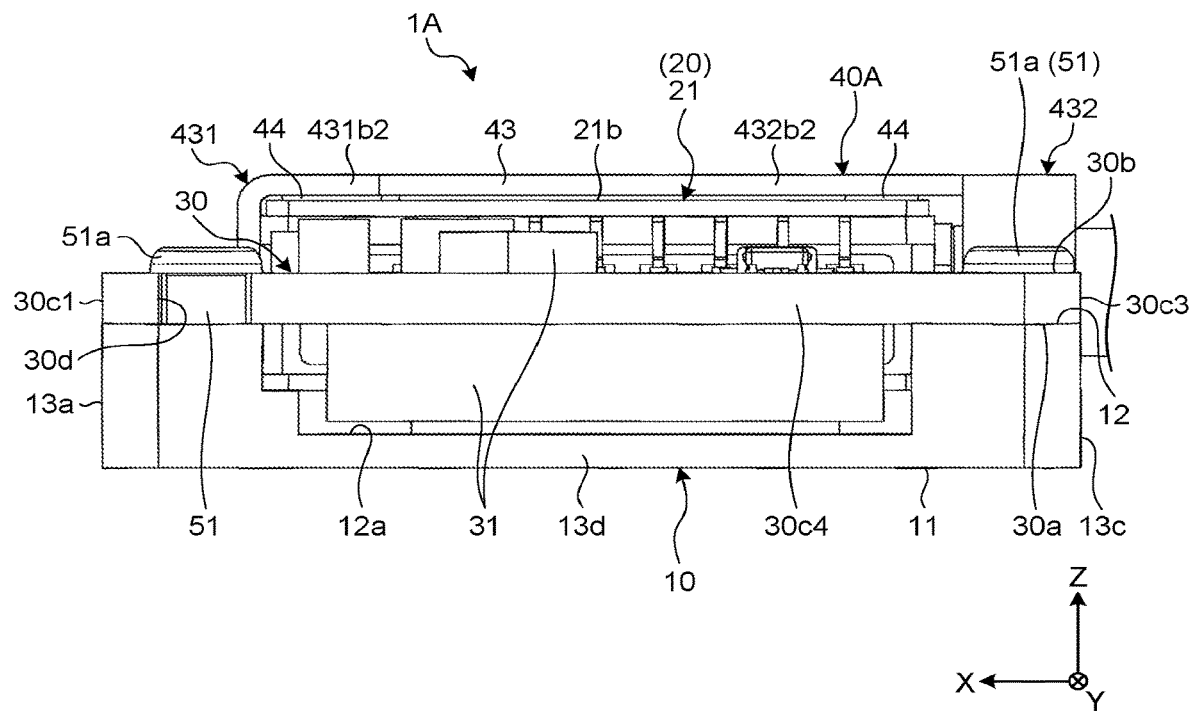
FIG. 5 is an exemplary and schematic side view of the optical device of the first embodiment.

FIG. 5 is a side view of the optical device 1A when viewed in the Y direction. As illustrated in FIG. 5, an elastic member 44 is interposed in each of the portions between the flat portion 431b2 and the top surface 21b of the head 21 and between the flat portion 432b2 and the top surface 21b. The flat portion 431b2 and the flat portion 432b2, that is, the intermediate portion 43 presses the top surface 21b, that is, the head 21 via the elastic member 44 in the direction opposite to the Z direction. The flat portion 431b2 and the flat portion 432b2 are examples of the pressing portion. Further, the elastic member 44 may also be referred to as an interposing member or an inclusion. It is preferable that the elastic member 44 has flexibility and is in an elastic compressed state in the attached state.

Figure 6:
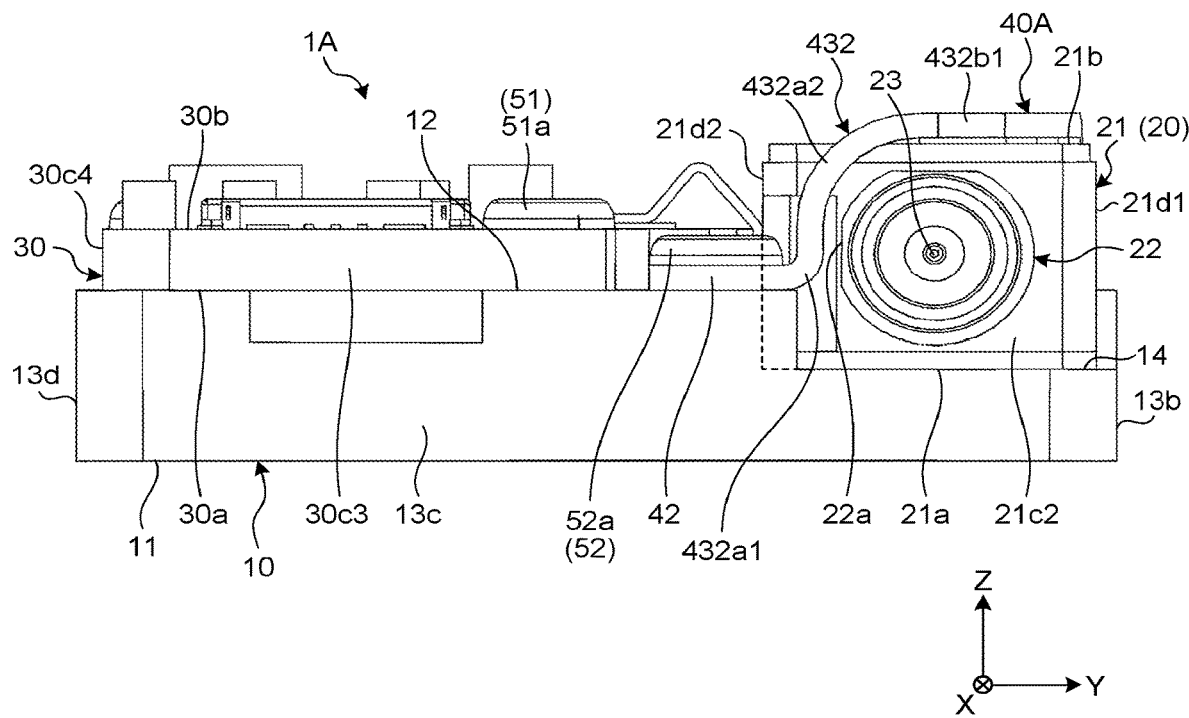
FIG. 6 is an exemplary and schematic side view of the optical device of the first embodiment and is a view seen in a direction different from that of FIG. 5.

FIG. 6 is a side view of the optical device 1A when viewed in the X direction. As illustrated in FIG. 6, the second fixing portion 42 is positioned to partially overlap the head 21 when viewed in the X direction. Further, the bent portions 432a1 and 432a2 are positioned on the side opposite to the side surface 13b of the base 10 with respect to the neck 22 in the Y direction. Then, the bent portion 432a2 is bent at intervals along the substantially cylindrical outer peripheral surface 22a of the neck 22. Further, when viewed in the X direction, the bent portions 432a1 and 432a2 are partially positioned between the side surface 21d2 of the head 21 and the outer peripheral surface 22a of the neck 22, and partially overlap the head 21.

As described above, in this embodiment, the first fixing portion 41 is positioned close to the side surface 13a (first end) of the base 10, and the second fixing portion 42 is positioned on the side opposite to the side surface 13a with respect to the head 21 and on the side opposite to the side surface 13b (second end) of the base 10 with respect to the neck 22.

In such a configuration, both the first fixing portion 41 and the second fixing portion 42 are deviated from the head 21 in the longitudinal direction (the X direction (first direction) or the direction opposite to the X direction) of the head 21. If at least one of the first fixing portion 41 and the second fixing portion 42 is deviated from the head 21 in the Y direction (second direction), in order to secure the arrangement area of the first fixing portion 41 between the head 21 and the side surface 13b of the base 10, the head 21 and the side surface 13b are necessarily separated in the Y direction, and as a result, the optical device 1A may become larger in the width direction. If at least one of the first fixing portion 41 and the second fixing portion 42 is deviated from the head 21 in the direction opposite to the Y direction, at least of the first fixing portion 41 and the second fixing portion 42 are interposed between the head 21 and the circuit substrate 30, and the optical device 1A may become larger in the width direction. In this regard, according to this embodiment, the first fixing portion 41 and the second fixing portion 42 are deviated from the head 21 in the longitudinal direction, and thus it is easy to prevent the optical device 1A from becoming large in the width direction.

In a case where the second fixing portion 42 is deviated from the neck 22 in the Y direction, in order to secure the arrangement area of the second fixing portion 42 between the neck 22 and the side surface 13b of the base 10, the neck 22 and the side surface 13b are necessarily separated in the Y direction, and further the head 21 and the side surface 13b are separated in the Y direction. As a result, the optical device 1A may become larger in the width direction. In this regard, according to this embodiment, the second fixing portion 42 is deviated from the neck 22 in the direction opposite to the Y direction, it is easy to prevent the optical device 1A from becoming larger in the width direction.

If the circuit substrate is configured to be provided with a notch for housing the optical module 20, it is necessary to secure gaps between both sides of the optical module 20 and the circuit substrate, and thus the optical device may become larger as much as the gaps on both sides. Further, the circuit substrate may become larger as much as wiring and an insulating layer are necessary to bypass the notch in the circuit substrate. In this regard, in this embodiment, the head 21 is arranged close to the side surface 13b of the base 10, the optical module 20 and the circuit substrate 30 are arranged side by side in the Y direction, it is not necessary to provide the circuit substrate 30 with a notch for housing the optical module 20, and thus the circuit substrate 30 can be configured in a shape closer to a rectangular shape. Thus, the optical device 1A can be configured more compactly in this regard as well.

In this embodiment, for example, in the extension portion 431 (first extension portion), the flat portion 431b2 (first portion) is positioned in the head 21 on the side opposite to the base 10. Further, the bent portion 431a1, the flat portion 431b1, and the bent portion 431a2 (second portion) extend between the flat portion 431b2 and the first fixing portion 41. Then, as illustrated in FIG. 3, when viewed in the direction opposite to the Z direction (that is, even when viewed in the Z direction (third direction)), the first fixing portion 41, the bent portion 431a1, the flat portion 431b1, and the bent portion 431a2 are arranged in the X direction.

If the first fixing portion 41 and the second portion between the first fixing portion 41 and the flat portion 431b2 (first portion) are arranged in the Y direction, the second portion covers the area, which is adjacent to the first fixing portion 41 in the Y direction or the direction opposite to the Y direction, of the top surface 12 of the base 10 in the Z direction, and thus it may be difficult to use the adjacent area. In this regard, in this embodiment, the first fixing portion 41 and the second portion are arranged in the X direction. Thus, the area, which is adjacent to the first fixing portion 41 in the Y direction or the direction opposite to the Y direction, of the top surface 12 can be used more effectively, for example, as an area for providing the opening 15a and the peripheral portion 15b (attached portion) for attaching the base 10 to another member, which allows the base 10 and further the optical device 1A to be configured more compactly to that extent compared to the configuration in which the opening 15a and the peripheral portion 15b are provided in another area of the base 10. However, the present disclosure is not limited to the configuration, and the area, which is adjacent to the first fixing portion 41 in the Y direction or the direction opposite to the Y direction, of the top surface 12 may be provided with a portion or configuration, such as the fixing portion of the circuit substrate 30, different from the opening 15a and the peripheral portion 15b.

In this embodiment, for example, in the extension portion 432 (second extension portion), the flat portion 432b2 (third portion) is positioned in the head 21 on the side opposite to the base 10. Further, the bent portion 432a1, the bent portion 432a2, and the flat portion 432b1 (fourth portion) extend between the flat portion 432b2 and the second fixing portion 42. As illustrated in FIG. 3, when viewed in the direction opposite to the Z direction (that is, even when viewed in the Z direction), the bent portion 432a1, the bent portion 432a2, and the flat portion 432b1 are deviated from the second fixing portion 42 in the Y direction.

With such a configuration, for example, the space around the neck 22 deviated from the second fixing portion 42 in the Y direction can be arranged with the fourth portion between the second fixing portion 42 and the flat portion 432b2 (third portion), which allows the optical device 1A to be configured more compactly by that extent.

In this embodiment, as illustrated in FIG. 3, when viewed in the direction opposite to the Z direction (that is, even when viewed in the Z direction (third direction)), the bent portion 431a1, the flat portion 431b1, and the bent portion 431a2 (second portion) is deviated from the first fixing portion 41 in the direction opposite (longitudinal direction) to the X direction, and the bent portion 432a1, the bent portion 432a2, and the flat portion 432b1 (fourth portion) are deviated from the second fixing portion 42 in the Y direction (width direction). That is, when viewed in the third direction, the fourth portion is deviated from the second fixing portion 42 in the direction (Y direction) which intersects the direction (the direction opposite to the X direction) in which the second portion is deviated from the first fixing portion 41.

In a case where the second portion is deviated from the first fixing portion 41 in the longitudinal direction (for example, the direction opposite to the X direction), the fourth portion is also deviated from the second fixing portion 42 in the longitudinal direction (for example, the X direction), and the second portion and the fourth portion have portions, such as a portion extending in the Z direction, which face respective end surfaces 21c1 and 21c2, the head 21 is sandwiched between the second portion and the fourth portion in the longitudinal direction. When the pressing member 40A and the head 21 interfere with each other in the X direction, the positioning of the head 21 with respect to the base 10 is hindered. Thus, it is necessary to avoid interference between the second and fourth portions and the head 21. Therefore, in this case, it is necessary to provide necessary gaps in the longitudinal direction between the second portion and the head 21 and between the fourth portion and the head 21, respectively. Accordingly, the second portion and the fourth portion are necessarily arranged apart from each other in the longitudinal direction, and the first fixing portion 41 and the second fixing portion 42 are necessarily separated from each other in the longitudinal direction. As a result, the optical device 1A may be larger in the longitudinal direction. Further, even in a case where the second portion is deviated from the first fixing portion 41 in the width direction (for example, the direction opposite to the Y direction), the fourth portion is deviated from the second fixing portion 42 in the width direction (for example, the Y direction), and the second portion and the fourth portion have portions, such as a portion extending in the Z direction, which face respective end surfaces 21d1 and 21d2, the same problem occurs. As a result, the optical device 1A may be larger in the width direction. In this regard, as in this embodiment, in the configuration in which when viewed in the third direction, the fourth portion is deviated from the second fixing portion 42 in the direction (for example, the Y direction) which intersects the direction (for example, the direction opposite to the X direction) in which the second portion is deviated from the first fixing portion 41, for example, the optical device 1A can be configured more compactly in the longitudinal direction and the width direction. Incidentally, in this embodiment, the direction (for example, the direction opposite to the X direction) in which the second portion is deviated from the first fixing portion 41 and the direction (for example, the Y direction) in which the fourth portion is deviated from the second fixing portion 42 are orthogonal to each other. However, the present disclosure is not limited to this as long as these directions intersect each other.

In this embodiment, for example, the bent portion 432a1 and the bent portion 432a2 (fourth portion) are partially arranged on the side opposite to the side surface 13b (second end) in the neck 22.

In this case, the space which is adjacent to the neck 22 on the side opposite to the Y direction can be used more effectively as the space for arranging the fourth portion.

In this embodiment, for example, when viewed in the X direction (first direction) as illustrated in FIG. 6, the second fixing portion 42 partially overlaps the head 21.

With such a configuration, for example, the second fixing portion 42 can be arranged closer to the neck 22 in the Y direction. Thus, compared to a configuration where the second fixing portion 42 does not overlap the head 21 and is arranged apart from the neck 22 in the direction opposite to the Y direction when viewed in the X direction, the optical device 1A can be configured more compactly in the Y direction (width direction).

In this embodiment, for example, in the intermediate portion 43, the extension portion 431 and the extension portion 432 are integrally connected.

With such a configuration, the pressing member 40A becomes one component, and advantages such as a reduction in the number of components and easy handling can be obtained.

Second Embodiment

Figure 7:
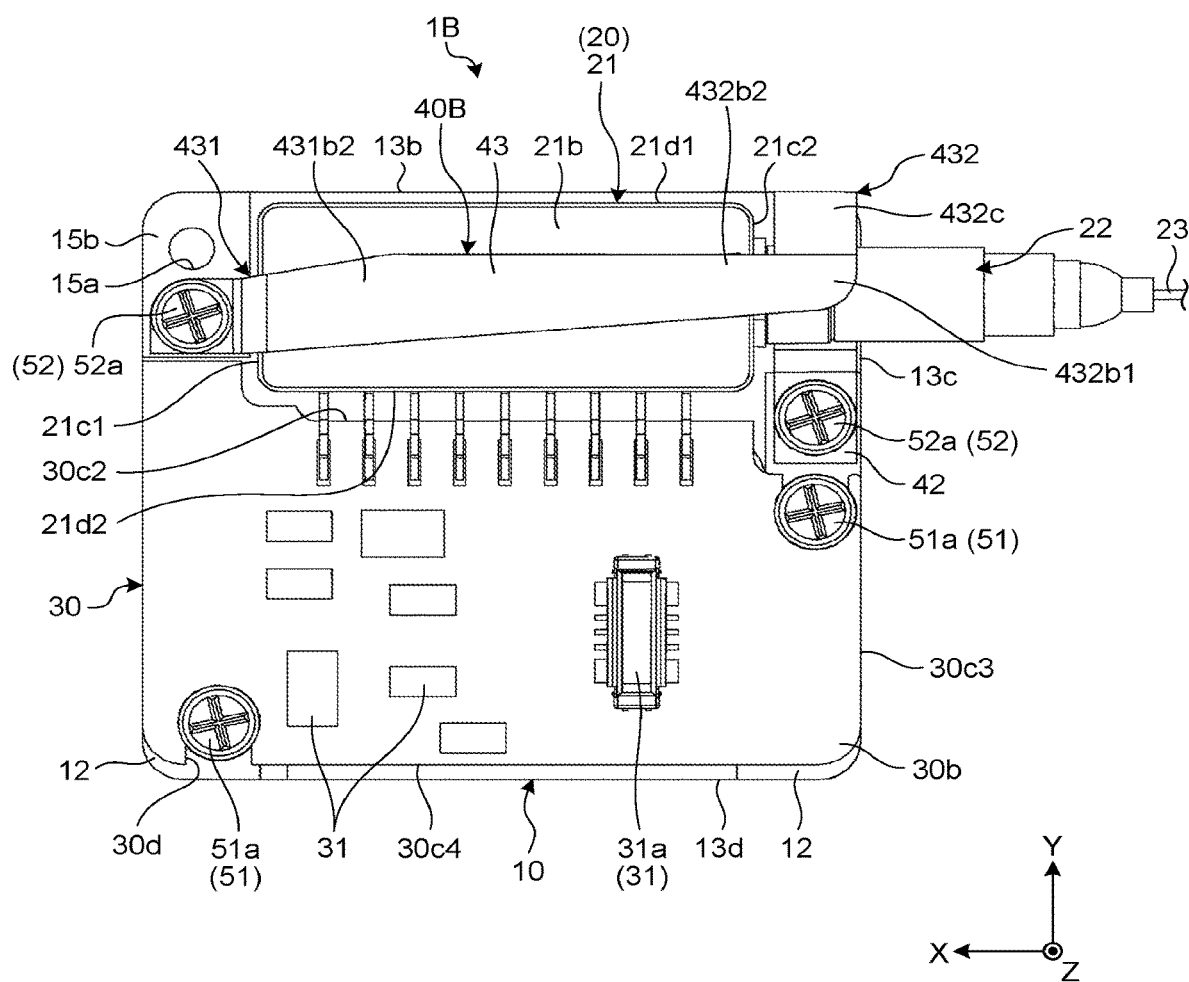
FIG. 7 is an exemplary and schematic plan view of the optical device of a second embodiment.
Figure 8:
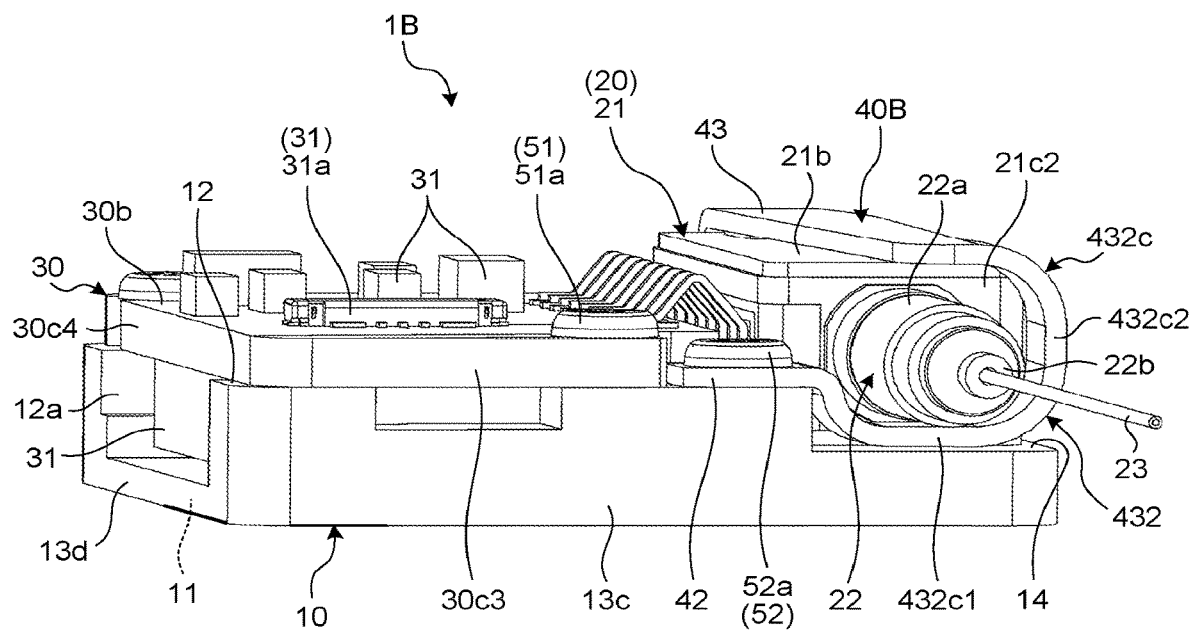
FIG. 8 is an exemplary and schematic perspective view of the optical device of the second embodiment.

FIG. 7 is a plan view of an optical device 1B of this embodiment, and FIG. 8 is a perspective view of the optical device 1B.

As is clear when comparing FIG. 7 with FIG. 3, in this embodiment and the first embodiment, the arrangement of the first fixing portion 41 and the opening 15a and the peripheral portion 15b is reversed in the Y direction. That is, the opening 15a and the peripheral portion 15b are positioned to be deviated from the first fixing portion 41 of a pressing member 40B in the Y direction (second direction).

Even in such a configuration, the same effect is obtained as that of a case where the opening 15a and the peripheral portion 15b are deviated from the first fixing portion 41 of the pressing member 40A in the direction opposite to the Y direction as in the first embodiment.

Further, as illustrated in FIG. 8, a fourth portion 432c between the second fixing portion 42 and the flat portion 432b2 (third portion) bypasses the neck 22 on the side opposite to the second fixing portion 42. That is, the fourth portion 432c has a portion 432c1 positioned between the neck 22 and the base 10 (stepped surface 14) and a portion 432c2 positioned closer to the side surface 13b (second end) of the base 10 than the neck 22.

With such a configuration, the space around the neck 22, in this case, the space which is deviated from the neck 22 in the direction opposite to the Z direction and the Y direction can be arranged with the fourth portion 432c between the second fixing portion 42 and the flat portion 432b2 (third portion), which allows the optical device 1B to be configured more compactly to that extent. Further, with such a configuration, for example, the extension portion 432 and further the pressing member 40B can be configured to be formed longer, which allows the stress generated in the pressing member 40B to be further reduced and the reliability of the pressing member 40B to be further improved to that extent.

Third Embodiment

Figure 9:
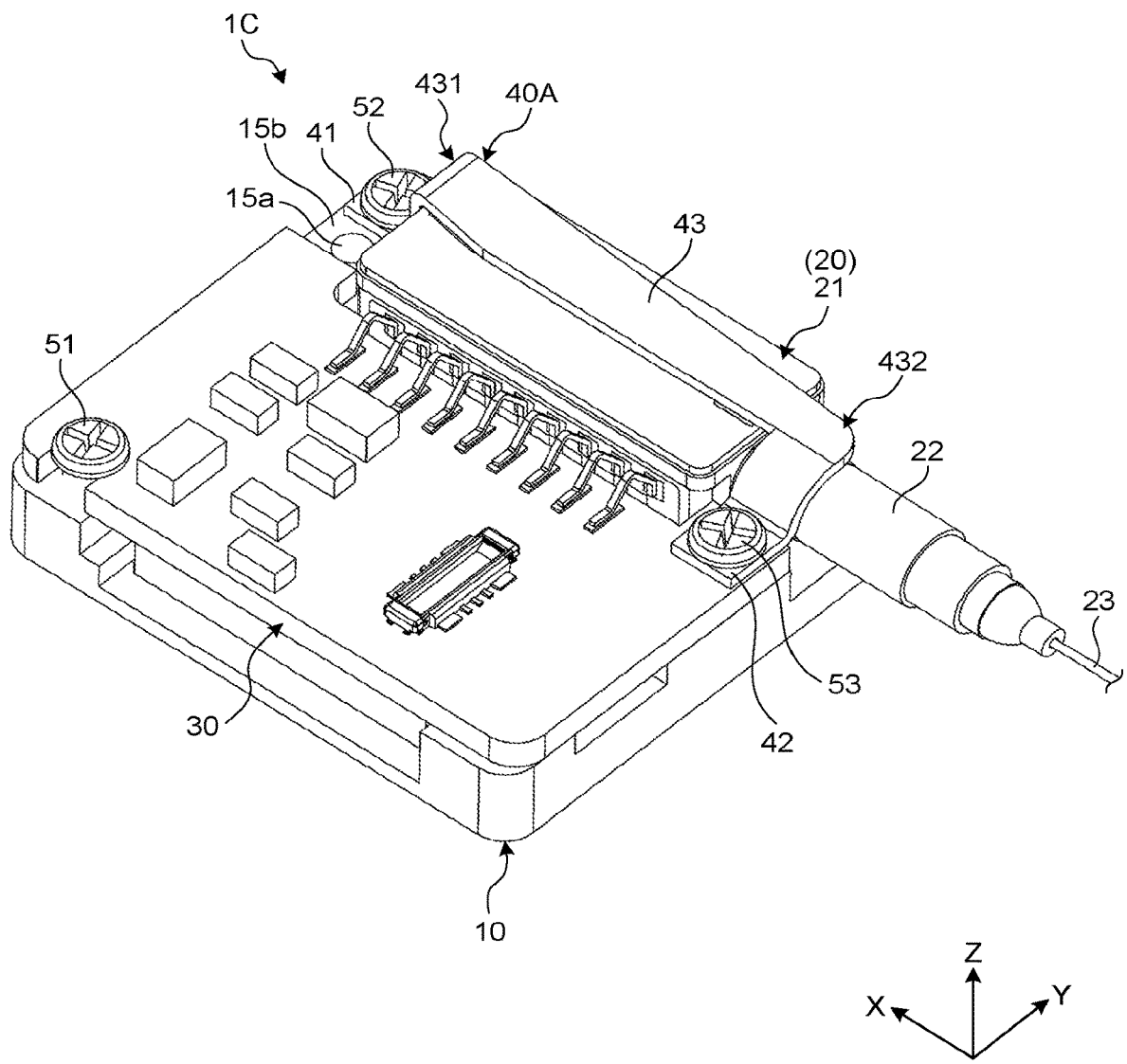
FIG. 9 is an exemplary and schematic perspective view of an optical device of a third embodiment.

FIG. 9 is a perspective view of an optical device 1C of this embodiment. As illustrated in FIG. 9, in this embodiment, a fixture 53 fixes the circuit substrate 30 and the second fixing portion 42 of the pressing member 40A to the base 10. Incidentally, the pressing member 40A has the same shape as that of the first embodiment although some portions have different dimensions. The fixture 53 is an example of the fixing member.

With such a configuration, for example, as compared with the configuration in which the circuit substrate 30 and the pressing member 40A are attached to the base 10 by separate fixtures 51 and 52, by sharing the fixtures, the number of fixtures and thus the number of components can be reduced, and the number of operations in manufacturing fixing can be reduced. Thus, it is possible to reduce the labor and manufacturing cost of manufacturing. Further, an advantage is also obtained that the area of the circuit substrate 30 can be increased, and further more components can be arranged.

Incidentally, in this embodiment, the base 10, the circuit substrate 30, and the second fixing portion 42 are arranged in this order in the Z direction. In other words, the circuit substrate 30 is positioned between the second fixing portion 42 and the base 10. Further, the fixture may be shared for the first fixing portion 41 in the same manner.

First Modification

Figure 10:
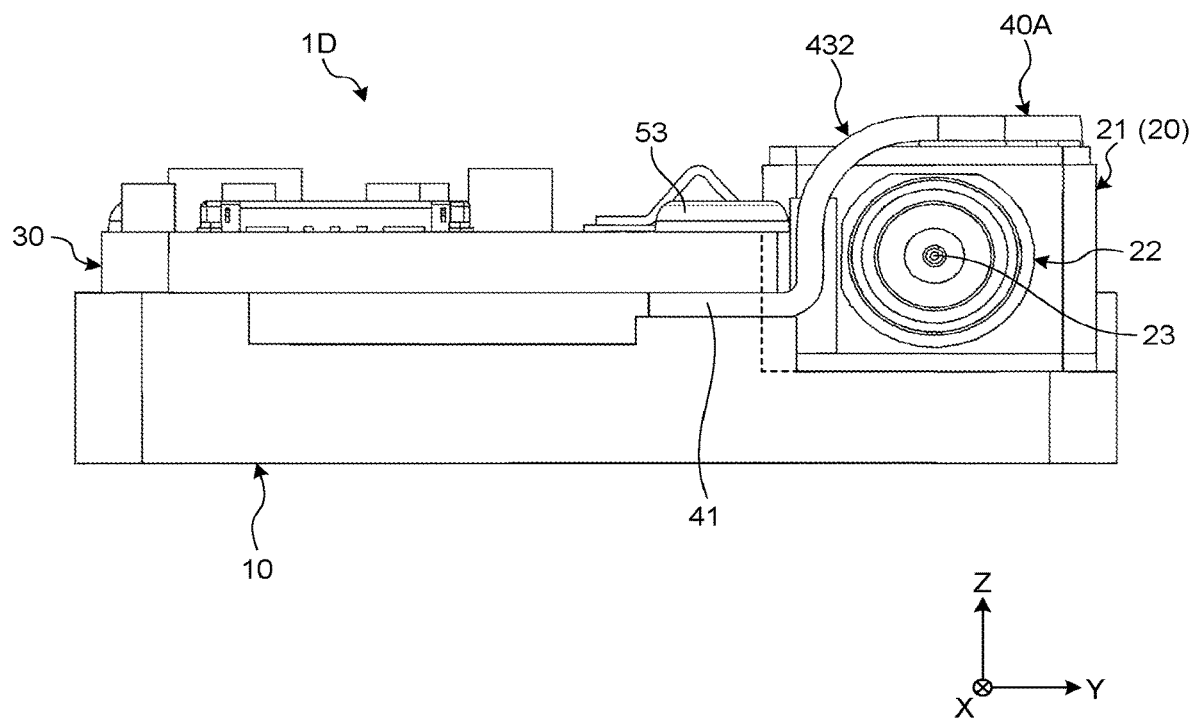
FIG. 10 is an exemplary and schematic side view of an optical device of a first modification.

FIG. 10 is a side view of an optical device 1D of this modification when viewed in the X direction. As illustrated in FIG. 10, also in this modification, the fixture 53 fixes the circuit substrate 30 and the second fixing portion 42 to the base 10 as in the third embodiment. Incidentally, also in this modification, the pressing member 40A has the same shape as that of the first embodiment and the third embodiment although some portion have different dimensions.

However, in this modification, the base 10, the second fixing portion 42, and the circuit substrate 30 are arranged in this order in the Z direction. In other words, the second fixing portion 42 is positioned between the circuit substrate 30 and the base 10. Even with such a configuration, the same effect as that of the third embodiment can be obtained. Further, also in this case, the fixture may be shared for the first fixing portion 41 in the same manner.

Second Modification

Figure 11:
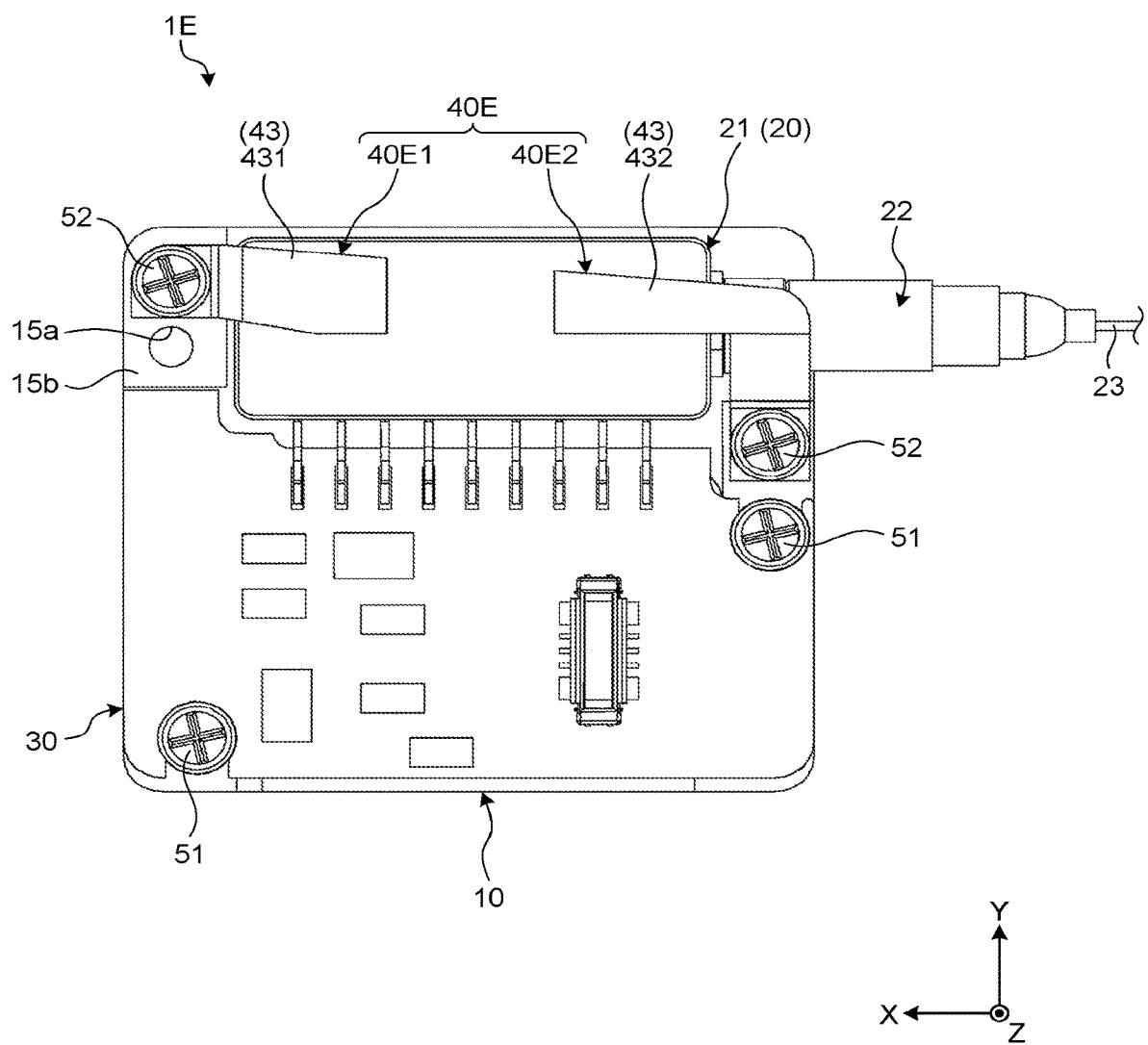
FIG. 11 is an exemplary and schematic plan view of an optical device of a second modification.

FIG. 11 is a plan view of an optical device 1E of this modification. As illustrated in FIG. 11, in this modification, a pressing member 40E is separated at the intermediate portion 43 and is divided into a member 40E1 having the extension portion 431 and a member 40E2 having the extension portion 432. The optical device 1E has the same configuration as that of the first embodiment except for this point. Also in such a configuration, the head 21 can be pressed against the base 10 by the extension portion 431 and the extension portion 432, and the arrangement and configuration of the first fixing portion 41, the second fixing portion 42, the extension portion 431, and the extension portion 432 are the same as those in the first embodiment except the separation. Thus, the same effects as those in the first embodiment can be obtained. Further, for example, the material of the pressing member 40E can be further reduced, which may allow the manufacturing cost to be reduced to that extent.

Third Modification

Figure 12:
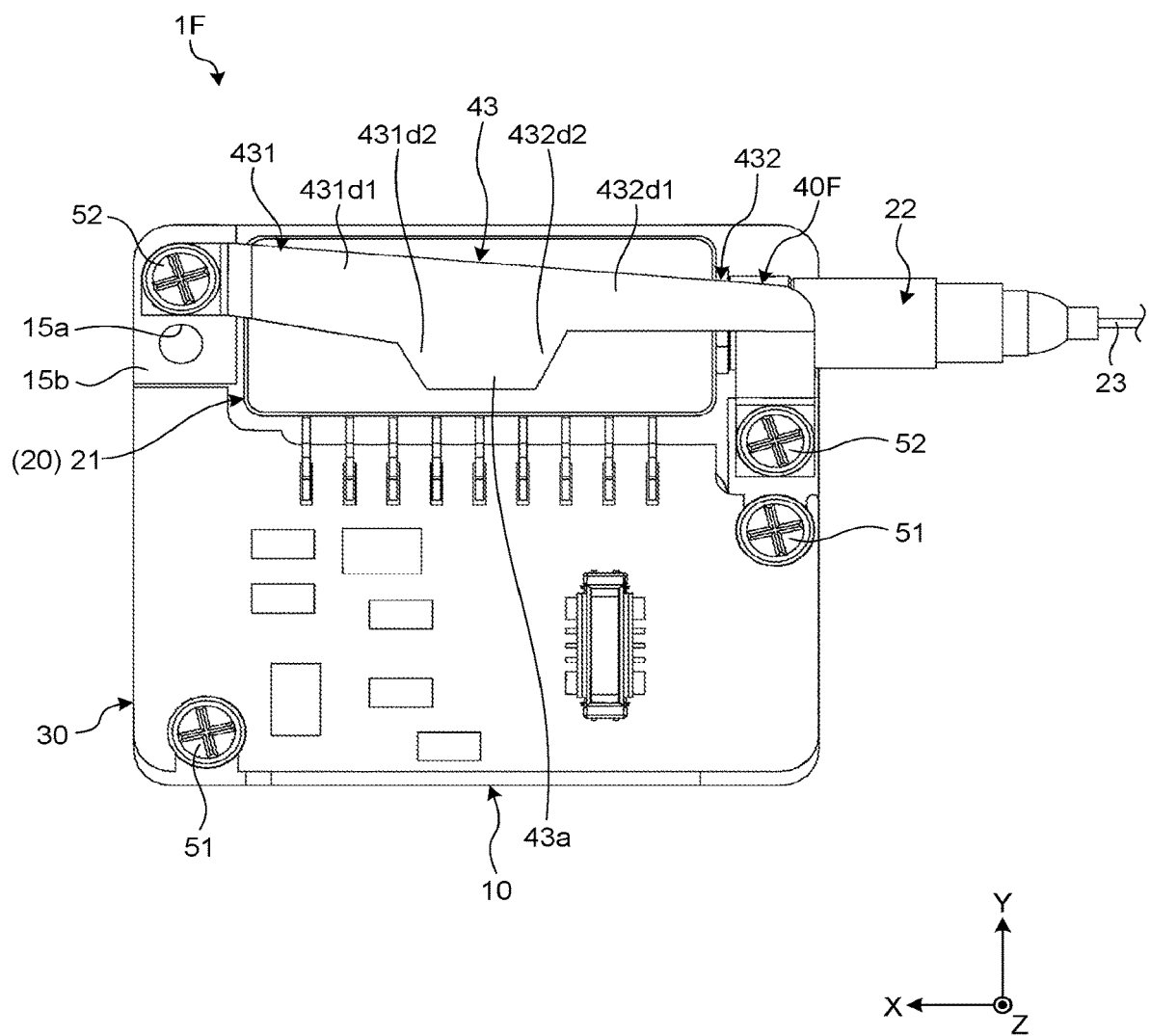
FIG. 12 is an exemplary and schematic plan view of an optical device of a third modification.

FIG. 12 is a plan view of an optical device 1F of this modification. As illustrated in FIG. 12, in this modification, the extension portion 431 (first extension portion) of a pressing member 40F has a (thick) portion 431d2 of which the width in the Y direction is different from that of the other portion 431d1, and the extension portion 432 (second extension portion) has a (thick) portion 432d2 of which the width in the Y direction is different from that of the other portion 432d1. In this modification, the extension portion 431 and the extension portion 432 configures an intermediate portion 43 which is integrally connected, and a protrusion 43a which protrudes in the direction opposite to the Y direction is provided in the longitudinally intermediate portion of the intermediate portion 43.

In such a configuration, the area where the pressing member 40F presses the head 21 can be expanded. Thus, it is possible to suppress the variation in the pressing pressure depending on the location of the head 21, and further to suppress the biased contact of the head 21 to the base 10, in other words, the inclination of the head 21 with respect to the base 10.

Fourth Modification

Figure 13:
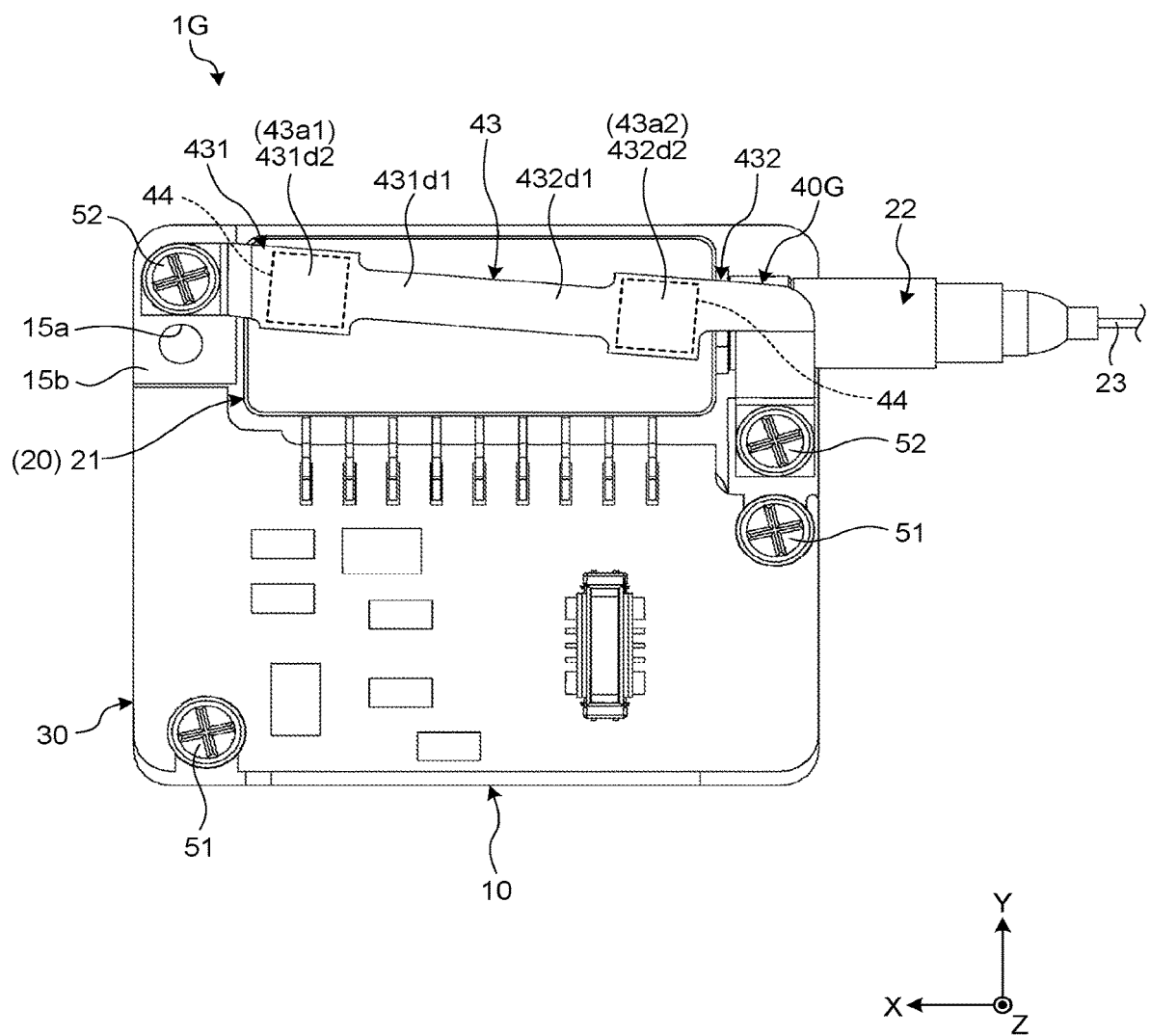
FIG. 13 is an exemplary and schematic plan view of an optical device of a fourth modification.

FIG. 13 is a plan view of an optical device 1G of this modification. As illustrated in FIG. 13, also in this modification, the extension portion 431 (first extension portion) of a pressing member 40G has the (thick) portion 431d2 of which the width in the Y direction is different from that of the other portion 431d1, and the extension portion 432 (second extension portion) has the (thick) portion 432d2 of which the width in the Y direction is different from that of the other portion 432d1. Also in this modification, the extension portion 431 and the extension portion 432 configures an intermediate portion 43 which is integrally connected, and wide portions 43a1 and 43a2 which protrude in the Y direction and the direction opposite to the Y direction are provided in both longitudinal ends of the intermediate portion 43. The wide portions 43a1 and 43a2 are examples of the protrusion.

Also in such a configuration, the area where the pressing member 40G presses the head 21 can be expanded. Thus, it is possible to suppress the variation in the pressing pressure depending on the location of the head 21, and further to suppress the biased contact of the head 21 to the base 10, in other words, the inclination of the head 21 with respect to the base 10.

The elastic member 44 may be interposed between the portions 431d2 and 432d2 (wide portions 43a1 and 43a2) having a width wider than the other portions and the top surface 21b of the head 21. In this case, for example, the protrusion of the elastic member 44 from the intermediate portion 43 can be suppressed to obtain an advantage that the reliability of the elastic member 44 can be improved.

Although the embodiments and modifications of the present disclosure have been illustrated above, the above-described embodiments and modifications are merely examples, and the scope of the disclosure is not intended to be limited. The above-described embodiment and modification can be implemented in various other forms, and various omissions, replacements, combinations, and changes can be made without departing from the gist of the disclosure. In addition, specifications such as each configuration and shape (structure, type, direction, model, size, length, width, thickness, height, number, arrangement, position, material, and the like) may be changed as appropriate as to be carried out.

For example, the positions of the first fixing portion and the second fixing portion in the Z direction (thickness direction) can be changed as appropriate.

According to the present disclosure, it is possible to obtain an optical device having a novel configuration with less inconvenience, for example, an optical device which can be configured more compactly.

Although the disclosure has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An optical device comprising:
    a base which has a first end in a first direction and a second end which is an end in a second direction intersecting the first direction and extends in the first direction;
    an optical module which has a head which is adjacent to the base in a third direction intersecting the first direction and the second direction and is positioned close to the second end in a posture in which a longitudinal direction of the head is along the first direction and a neck which protrudes from the head in a direction opposite to the first direction and is thinner than the head;
    a substrate which is attached on the base to be arranged with the head in the second direction;
    a pressing member which has a first fixing portion which is fixed to the base to be close to the first end, a second fixing portion which is fixed to the base on a side opposite to the first end with respect to the head and on a side opposite to the second end with respect to the neck, a first extension portion which extends from the first fixing portion, a second extension portion which extends from the second fixing portion, and a pressing portion which is provided in at least one of the first extension portion and the second extension portion and presses the head against the base in a direction opposite to the third direction; and
    an attached portion which is positioned to be deviated from the first fixing portion in the second direction or a direction opposite to the second direction and to which a fixing member which fixes the base to another member is to be attached.

2. The optical device according to claim 1, wherein the first extension portion has a first portion which is positioned on a side opposite to the base with respect to the head in the third direction and a second portion which extends between the first portion and the first fixing portion, and the first fixing portion and the second portion are arranged in the first direction when viewed in the third direction.

3. An optical device comprising:
    a base which has a first end in a first direction and a second end which is an end in a second direction intersecting the first direction and extends in the first direction;
    an optical module which has a head which is adjacent to the base in a third direction intersecting the first direction and the second direction and is positioned close to the second end in a posture in which a longitudinal direction of the head is along the first direction and a neck which protrudes from the head in a direction opposite to the first direction and is thinner than the head;
a substrate which is attached on the base to be arranged with the head in the second direction;
a pressing member which has a first fixing portion which is fixed to the base to be close to the first end, a second fixing portion which is fixed to the base on a side opposite to the first end with respect to the head and on a side opposite to the second end with respect to the neck, a first extension portion which extends from the first fixing portion, a second extension portion which extends from the second fixing portion, and a pressing portion which is provided in at least one of the first extension portion and the second extension portion and presses the head against the base in a direction opposite to the third direction, wherein the second extension portion has a third portion which is positioned on the side opposite to the base with respect to the head in the third direction and a fourth portion which extends between the third portion and the second fixing portion, and the fourth portion is positioned to be deviated from the second fixing portion in the second direction when viewed in the third direction.

4. The optical device according to claim 3, wherein the fourth portion is partially positioned on the side opposite to the second end with respect to the neck.

5. The optical device according to claim 3, wherein the fourth portion is partially positioned between the neck and the base and partially positioned closer to the second end than the neck.

6. The optical device according to claim 1, wherein the second fixing portion is positioned to overlap the head when viewed in the first direction.

7. The optical device according to claim 1, wherein
at least one of the first fixing portion and the second fixing portion is attached to the base via a fixing member, and
the substrate is attached to the base by the fixing member.

8. The optical device according to claim 7, wherein the substrate is positioned between at least one of the first fixing portion and the second fixing portion and the base.

9. An optical device comprising:
a base which has a first end in a first direction and a second end which is an end in a second direction intersecting the first direction and extends in the first direction;
an optical module which has a head which is adjacent to the base in a third direction intersecting the first direction and the second direction and is positioned close to the second end in a posture in which a longitudinal direction of the head is along the first direction and a neck which protrudes from the head in a direction opposite to the first direction and is thinner than the head;
a substrate which is attached on the base to be arranged with the head in the second direction; and
a pressing member which has a first fixing portion which is fixed to the base to be close to the first end, a second fixing portion which is fixed to the base on a side opposite to the first end with respect to the head and on a side opposite to the second end with respect to the neck, a first extension portion which extends from the first fixing portion, a second extension portion which extends from the second fixing portion, and a pressing portion which is provided in at least one of the first extension portion and the second extension portion and presses the head against the base in a direction opposite to the third direction, wherein:
at least one of the first fixing portion and the second fixing portion is attached to the base via a fixing member,
the substrate is attached to the base by the fixing member, and
at least one of the first fixing portion and the second fixing portion is positioned between the substrate and the base.

10. The optical device according to claim 1, wherein the first extension portion and the second extension portion are connected integrally.

11. An optical device comprising:
a base which has a first end in a first direction and a second end which is an end in a second direction intersecting the first direction and extends in the first direction;
an optical module which has a head which is adjacent to the base in a third direction intersecting the first direction and the second direction and is positioned close to the second end in a posture in which a longitudinal direction of the head is along the first direction and a neck which protrudes from the head in a direction opposite to the first direction and is thinner than the head;
a substrate which is attached on the base to be arranged with the head in the second direction; and
a pressing member which has a first fixing portion which is fixed to the base to be close to the first end, a second fixing portion which is fixed to the base on a side opposite to the first end with respect to the head and on a side opposite to the second end with respect to the neck, a first extension portion which extends from the first fixing portion, a second extension portion which extends from the second fixing portion, and a pressing portion which is provided in at least one of the first extension portion and the second extension portion and presses the head against the base in a direction opposite to the third direction, wherein the first extension portion and the second extension portion are separated from each other.

12. An optical device comprising:
a base which has a first end in a first direction and a second end which is an end in a second direction intersecting the first direction and extends in the first direction;
an optical module which has a head which is adjacent to the base in a third direction intersecting the first direction and the second direction and is positioned close to the second end in a posture in which a longitudinal direction of the head is along the first direction and a neck which protrudes from the head in a direction opposite to the first direction and is thinner than the head;
a substrate which is attached on the base to be arranged with the head in the second direction; and
a pressing member which has a first fixing portion which is fixed to the base to be close to the first end, a second fixing portion which is fixed to the base on a side opposite to the first end with respect to the head and on a side opposite to the second end with respect to the neck, a first extension portion which extends from the first fixing portion, a second extension portion which extends from the second fixing portion, and a pressing portion which is provided in at least one of the first extension portion and the second extension portion and presses the head against the base in a direction opposite to the third direction, wherein the first extension portion has portions having different widths in the second direction.

13. An optical device comprising:
a base which has a first end in a first direction and a second end which is an end in a second direction intersecting the first direction and extends in the first direction;
an optical module which has a head which is adjacent to the base in a third direction intersecting the first direction and the second direction and is positioned close to the second end in a posture in which a longitudinal direction of the head is along the first direction and a neck which protrudes from the head in a direction opposite to the first direction and is thinner than the head;
a substrate which is attached on the base to be arranged with the head in the second direction; and
a pressing member which has a first fixing portion which is fixed to the base to be close to the first end, a second fixing portion which is fixed to the base on a side opposite to the first end with respect to the head and on a side opposite to the second end with respect to the neck, a first extension portion which extends from the first fixing portion, a second extension portion which extends from the second fixing portion, and a pressing portion which is provided in at least one of the first extension portion and the second extension portion and presses the head against the base in a direction opposite to the third direction, wherein the second extension portion has portions having different widths in the second direction.

14. An optical device comprising:
a base which has a first end in a first direction and a second end which is an end in a second direction intersecting the first direction and extends in the first direction;
an optical module which has a head which is adjacent to the base in a third direction intersecting the first direction and the second direction and is positioned close to the second end in a posture in which a longitudinal direction of the head is along the first direction and a neck which protrudes from the head in a direction opposite to the first direction and is thinner than the head;
a substrate which is attached on the base to be arranged with the head in the second direction; and
a pressing member which has a first fixing portion which is fixed to the base to be close to the first end, a second fixing portion which is fixed to the base on a side opposite to the first end with respect to the head and on a side opposite to the second end with respect to the neck, a first extension portion which extends from the first fixing portion, a second extension portion which extends from the second fixing portion, and a pressing portion which is provided in at least one of the first extension portion and the second extension portion and presses the head against the base in a direction opposite to the third direction, wherein at least one of the first extension portion and the second extension portion has a protrusion which protrudes in the second direction or the direction opposite to the second direction.

15. The optical device according to claim 1, wherein the optical module has a semiconductor laser.

16. The optical device according to claim 1, wherein the optical module has a wavelength-tunable laser.

* * * * *